United States Patent
Mori et al.

(10) Patent No.: US 6,973,177 B2
(45) Date of Patent: Dec. 6, 2005

(54) PRIVATE BRANCH EXCHANGE

(75) Inventors: Hiroshi Mori, Kasuga (JP); Masashi Furuno, Fukuoka (JP); Kazuyuki Sato, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 286 days.

(21) Appl. No.: 10/257,797

(22) PCT Filed: Feb. 19, 2002

(86) PCT No.: PCT/JP02/01435

§ 371 (c)(1),
(2), (4) Date: Oct. 16, 2002

(87) PCT Pub. No.: WO02/067596

PCT Pub. Date: Aug. 29, 2002

(65) Prior Publication Data
US 2003/0152214 A1  Aug. 14, 2003

(30) Foreign Application Priority Data
Feb. 20, 2001  (JP) .............................. 2001-43032

(51) Int. Cl.[7] .............................................. H04M 5/00
(52) U.S. Cl. ...................... 379/330; 379/328; 361/600; 361/601; 361/602
(58) Field of Search .............................. 379/319, 320, 379/325, 328, 330, 326, 327, 413.04; D13/184; D14/140.2, 445; 361/600, 601, 602, 622, 361/627

(56) References Cited

U.S. PATENT DOCUMENTS

| 4,304,966 | A | * | 12/1981 | Beirn et al. ................. 379/165 |
| D307,752 | S | * | 5/1990 | Yoshida et al. ......... D14/140.2 |
| D338,874 | S | * | 8/1993 | Renard ....................... D13/184 |
| 5,235,133 | A | * | 8/1993 | Roth et al. ..................... 174/37 |
| 5,548,086 | A | * | 8/1996 | Greenfield et al. ........... 174/48 |
| 5,832,073 | A | * | 11/1998 | Hannigan et al. ........... 379/325 |
| 6,301,095 | B1 | * | 10/2001 | Laughlin et al. ............ 361/624 |
| D450,665 | S | * | 11/2001 | Isely et al. ................. D13/184 |

FOREIGN PATENT DOCUMENTS

JP          5-160586       6/1993

* cited by examiner

Primary Examiner—Bing Q. Bui
(74) Attorney, Agent, or Firm—RatnerPrestia

(57) ABSTRACT

Disclosed is a private branch exchange (PBX) that offers high efficiency in wiring cables, at the same time, protects cables in highly safety manner. The PBX includes a PBX section and a casing that covers and holds the PBX section. The casing contains an inner-bottom plate, a support column, and a pedestal. Cables for connections with external circuitry can be connected to the PBX section on the front side of the interior of the casing. The inner-bottom plate holds the bottom of the portion of the casing on which the PBX section is accommodated. The support column is disposed on the lower surface of the inner-bottom plate. Disposed beneath the support column, the pedestal holds the entire of the casing. The support column has a curved surface on the front side, protecting cables wired between the inner-bottom plate and the pedestal.

18 Claims, 6 Drawing Sheets

PRIVATE BRANCH EXCHANGE

THIS APPLICATION IS A U.S. NATIONAL PHASE APPLICATION OF PCT INTERNATIONAL APPLICATION PCT/JP02/91435.

FIELD OF THE INVENTION

The present invention relates to a private branch exchange (PBX) that allows a plurality of terminals to make an extension call or an outside call. More particularly, it relates to a PBX that offers easy wiring for cables to be connected to the terminals.

BACKGROUND OF THE INVENTION

Recently, a private branch exchange (PBX) has been widely used in a local area, such as in an office and a building. Connected to a PBX via cables, a plurality of telephones disposed in such an office and a building make an extension call with each other, or make an outside call via a public telephone line.

In making an extension call or an outside call, a PBX works as follows:

(1) In making an extension call, the PBX offers connection between specific terminals among a plurality of terminals such as telephones connected via cables.

(2) In making an outside call, the PBX offers connection between a terminal and a public telephone line.

In PBXs described above, free-slot type PBXs have been widely used. The free-slot type PBX contains a plurality of terminal cards each of which has a link-up connector. The link-up connectors are mounted on a plurality of shelves formed in a casing so that each connector is disposed in the front side of the casing. Each terminal card, which is removably fixed on a backboard disposed behind in the interior of the casing, is exchangeable and expandable in number.

The free-slot type PBX is able to accept an add-on terminal card corresponding to a terminal additionally connected to the PBX. This allows the PBX to be ready for an increase in the number of terminals connected thereto, with no need for an extra PBX.

The casing as the exterior of the free-slot type PBX usually has a generally rectangular parallelepiped shape. Terminals of the link-up connectors for connecting to terminals including telephones are disposed in the front side of the casing of each terminal card. A removable or retractable front cover is disposed in front of the casing so as to cover the front at which the linkup connectors are disposed. The structure described above provides the PBX with ease of use and an improved exterior.

In installing a PBX, cable-wiring is generally done below.

The cable connected with a link-up connector passes through a clearance formed between components in the casing to go outside from behind or a side of the casing. A front cover covers the front of the casing, which enhances safety in operation and offers a neat appearance.

Now will be described a prior-art PBX with reference to the accompanying drawings.

FIG. 5 is a perspective view indicating the essential part of a prior-art typical PBX.

In typical PBX 21 shown in FIG. 5, top cover 22 forms the top surface of a casing; similarly, front cover 23 and side cover 24 form the front and the side surfaces of the casing, respectively.

Front cover 23 is removably fixed to PBX 21 by screws or the like, or may be retractably formed.

FIG. 6 is a front view indicating the essential part of the prior-art PBX with a front cover removed.

In PBX 21 shown in FIG. 6, elements similar to those shown in FIG. 5, such as top cover 22 and side cover 24, have the same reference numbers, and descriptions of those elements are omitted.

Shelves 26 are formed in the casing so as to have at least a plurality of shelves each of which has an opening on the front side of PBX 21. Terminal cards 27 are slotted into each of shelves 26. Link-up connectors 28 are disposed on the front side of each of terminal cards 27. Cables 29 are connected with each of connectors 28. A clearance formed between components disposed in the interior of the casing forms cable path 30.

Terminal cards 27 include an extension-call unit card and an outside-call unit card that have a telephone-exchange function. The cards are removably slotted into PBX 21 in such a manner that the link-up connectors of the cards are placed on the front side of the casing of PBX 21.

Here will be described the wiring of cables 29 in such structured prior-art PBX, referring to the accompanying drawing.

Cables 29, as shown in FIG. 6, are wired from the front side of the casing, through cable path 30 disposed in the interior of the casing, to the rear side of the casing.

Prior to the wiring of cables 29, front cover 23 is removed. After connected with link-up connectors 28, cables 29 are wired through cable path 30. Then, removing front cover 23 only has not offered to an operator with enough room for wiring cables 29 due to the small-sized openings of cable path 30. Therefore, the operator removes side cover 24 and a back cover (not shown) to wire cables 29 through cable path 30 from the side of the casing.

That is, the prior-art PBX has inconveniencies as follows:

(1) The prior-art PBX imposes described below on the operator: for wiring cables through the interior of the casing, the operator removes or opens the front cover; then removes the side cover and the back cover from the side and the rear of the casing of the PBX; then wires the cable through the clearance formed between components disposed in the casing. The process above has been repeatedly performed. Such bothersome work has thus lowered efficiency in wiring and maintenance work.

(2) The prior-art PBX has used, as the cable path, the clearance formed between components disposed in the casing. In the casing, there are opened metals or the like, which form components disposed in the casing. Therefore, in the works, care is needed in wiring cables without causing defects from contacting other components in the casing.

SUMMARY OF THE INVENTION

It is therefore the object of the present invention to provide a private branch exchange (PBX) that offers a highly efficient cable-wiring with and cable-protection.

The PBX of the present invention includes a private branch exchange (PBX) section and a casing that serves as a cover and holder for the PBX section. The casing further includes an inner-bottom plate, support column, and a pedestal. A cable that provides outside connection can be connected to the PBX section at the front side of the interior of the casing.

The inner-bottom plate holds the bottom portion of the casing on which the PBX section is mounted. The support column is disposed on the lower surface of the inner-bottom plate. Disposed beneath the support column, the pedestal holds the entire of the casing. The front side of the support column is formed into a curved surface so as to protect the cable wired between the inner-bottom plate and the pedestal.

The structure described above allows the cables connecting between the PBX and terminals to be easily wired from the front to the side or rear of the PBX. Besides, only removing the front cover allows wiring to be performed without removing the side cover form the casing. Accordingly, the PBX provides efficiency in works for the maintenance and wiring. Furthermore, the PBX having the structure above protects the cables wired in safe manner, in the wiring works.

DESCRIPTION OF THE PREFERRED EMBODIMENTS

A preferred embodiment of the present invention is described hereinafter with reference to the accompanying drawings.

Figure 1:
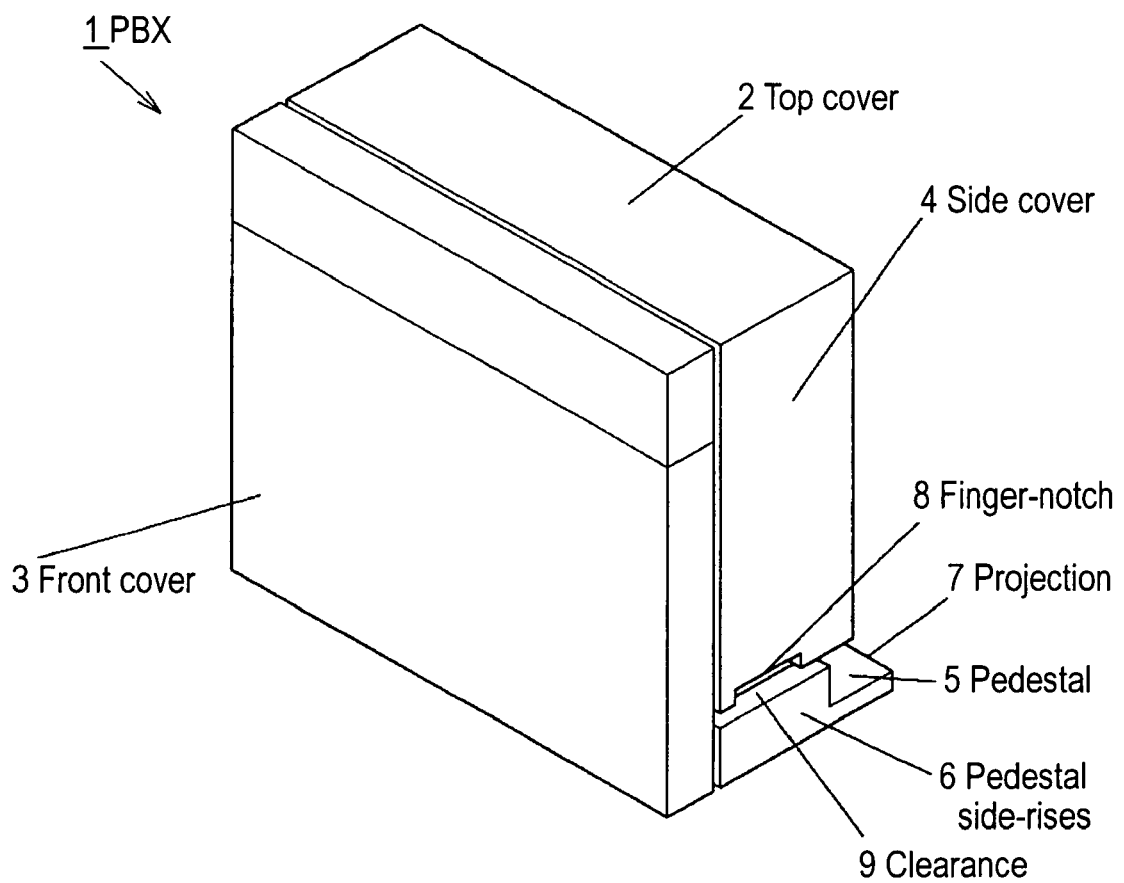
FIG. 1 is a perspective view indicating the essential part of a private branch exchange (PBX) in accordance with a preferred embodiment of the present invention.

FIG. 1 is a perspective view indicating the essential part of a private branch exchange (PBX) in accordance with the preferred embodiment of the present invention.

In PBX 1 shown in FIG. 1, top cover 2, front cover 3, and side cover 4 form the top, the front, and the side surfaces, respectively, of a casing of PBX 1. Plate-like pedestal 5 forms the bottom of the casing of PBX 1. Pedestal side-rises 6 are formed under side-cover 4. Side-rises 6 are placed integrally with pedestal 5 at the both sides of pedestal 5 and stand substantially vertical to pedestal 5. Projection 7 forms an end of pedestal 5 on the rear side of PBX 1, protruding outwardly beyond the rear of the casing. The lower end of side cover 4 is notched to form shallow U-shaped finger-notch 8. Side cover 4 and side-rises 6 have clearance 9 therebetween.

Front cover 3 is disposed over PBX 1 so as to be removable by screws, or to be formed as a retractable cover.

Projection 7 is integrally formed with pedestal 5 so that the rear end protrudes outwardly beyond the rear of the casing. When PBX 1 is mounted on a wall, PBX 1 is disposed maintaining a distance from the wall by the protruding length of projection 7. This protects the rear of the casing of PBX 1 from contacting the wall or the like.

Projection 7 may be formed by outwardly protruding a portion of the rear end of pedestal 5, for example, a portion close to the middle or both ends of pedestal 5.

Pedestal 5 is preferably formed into a shape generally the same as that of top cover 2, thereby a plurality of PBXs 1 can be formed into a stacking arrangement. This can save the installation space for PBX 1.

Clearance 9 formed between pedestal side-rises 6 and side cover 4 is enough wide so as to pass through cables, as that will be described later. However, an oversized width of clearance 9 is not necessary so as not to ruin the appearance of PBX 1.

Finger-notch 8 is formed by cutting out the lower edge of side cover 4 in a shallow U-shape. When the operator moves PBX 1, the operator's hands touch the portion that is cut for forming finger-notch 8. Therefore, the cutting edge of finger-notch 8 should preferably be smoothly formed.

Figure 2:
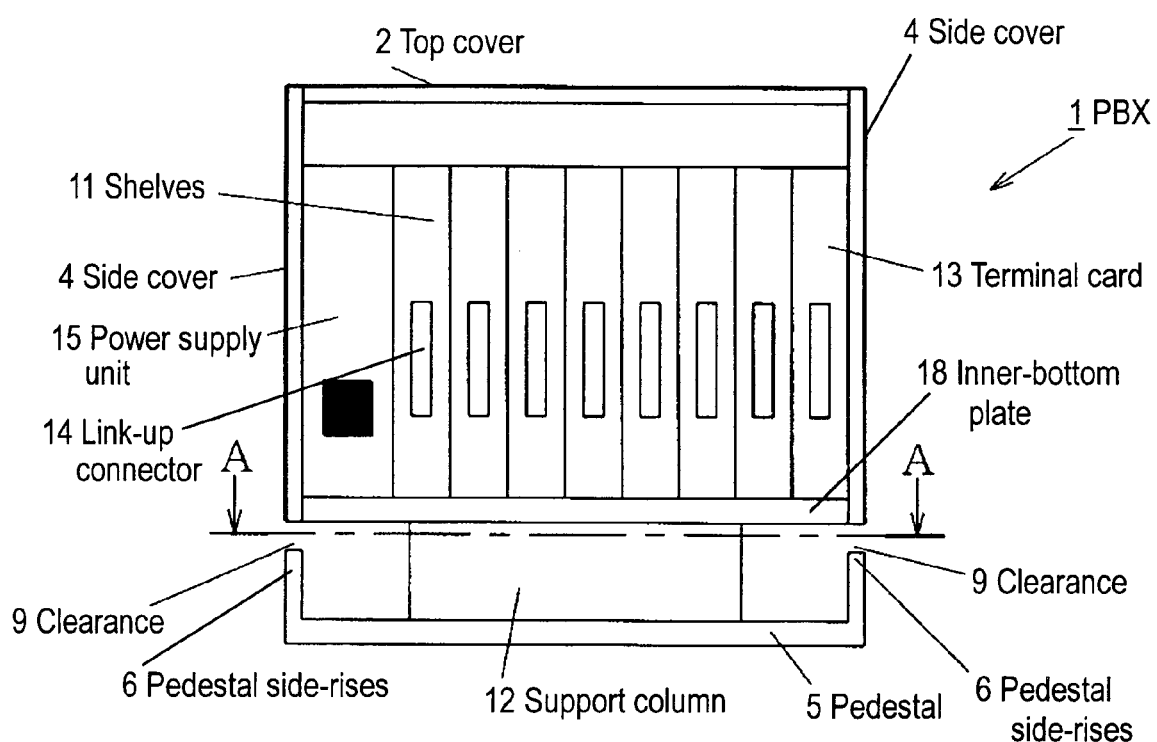
FIG. 2 is a front view indicating the essential part of the PBX with a front cover removed in accordance with the preferred embodiment.

FIG. 2 is a front view indicating the essential part of the PBX with a front cover removed in accordance with the preferred embodiment.

In PBX 1 shown in FIG. 2, portions similar to those shown in FIG. 1, that is, top cover 2, side cover 4, pedestal 5, side-rises 6, and clearance 9 have the same reference numbers, and descriptions of those are omitted.

Shelves 11 are formed in the casing so as to have at least a plurality of shelves each of which has an opening on the front side of PBX 1.

The PBX section is accommodated in the casing. The PBX section includes components indispensable for the PBX function, such as terminal cards 13, link-up connectors 14, and power supply unit 15.

Terminal cards 13 are slotted into each of shelves 11. Each of connectors 14 is disposed on the front side of each terminal card 13. Power supply unit 15 supplies power to PBX 1 disposed in the interior of the casing.

Inner-bottom plate 18 of the casing, together with top cover 2 and side cover 4, forms a clearance to accommodate shelves 11 and power supply unit 15 therein. At the same time, plate 18 holds the bottom portion of shelves 11 and power supply unit 15. Top cover 2 and side cover 4 are also held from the underneath by plate 18.

Integrally formed with pedestal 5, column-shaped support column 12 is generally centered on the upper surface of pedestal 5. Column 12 supports inner-bottom plate 18.

Support column 12, as described above, is formed in one-piece structure with pedestal 5 at a general center of pedestal 5. Pedestal 5 and support column 12 are made of metal or synthetic resin.

Preferably, the components forming the casing of PBX 1—top cover 2, front cover 3, side cover 4, and inner-bottom plate 18—are made of the same material as that forming pedestal 5 and support column 12. This provides PBX 1 with a good appearance.

Terminal card 13 is an extension unit card or outside-call unit card having a telephone-exchange function or the like. Each card is removably slotted into shelves 11 in such a way that the ling-up connector is placed in the front side of the casing of PBX 1.

Figure 3:
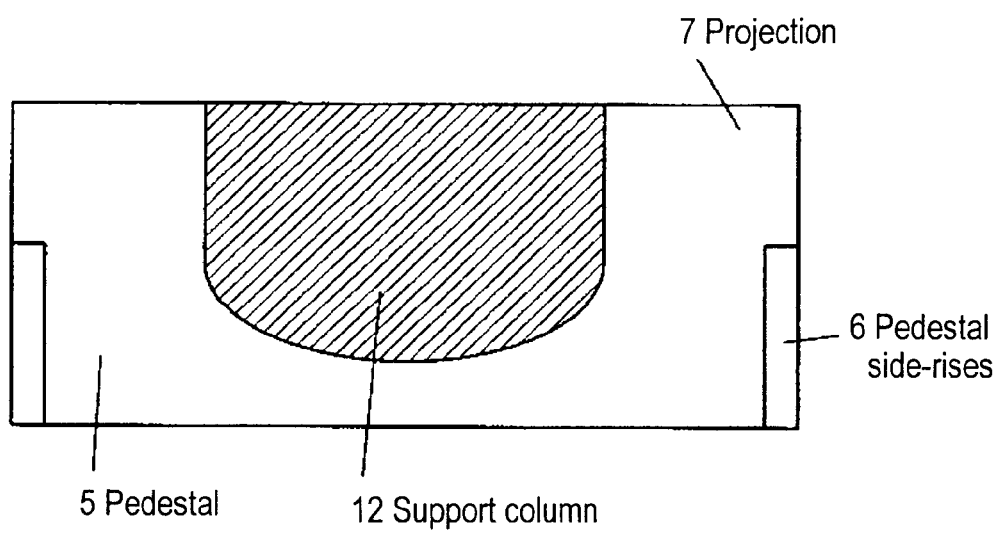
FIG. 3 is a cross-sectional view of the PBX, taken along line A-A in FIG. 2, looking in the direction of the arrows.

FIG. 3 is a cross-sectional view of the PBX, taken along line A—A in FIG. 2, looking in the direction of the arrows.

In PBX 1 shown in FIG. 3, elements similar to those shown in FIGS. 1 and 2, namely, pedestal 5, side-rises 6, projection 7, and support column 12, have the same reference numbers, and descriptions of those are omitted.

Support column 12 is preferably formed into a general cylindrical column or a general elliptic column having no corners on both sides or on the front thereof. This protects cables from causing scratches and other defects during wiring work as described later.

In the preferred embodiment, support column 12 has a general oval shape in section on the front side only.

The support column, as described above, has a smooth curve at least on the front side on which the cables run through. Such curved surface protects the cables from causing scratches and other defects even if the cables contact with the surface during wiring work.

The cables are wired from the front side to the rear side of the PBX. Therefore, the support column preferably has a curved surface at least on the front to the side of the column on which the cables run through.

FIGS. 1, 2, and 3 do not show the cables of communication terminals (typically telephones) that are connected to link-up connectors 14.

Now will be described how to wire the cables in the PBX having the structured above of the preferred embodiment, referring to the accompanying drawings.

Figure 4:
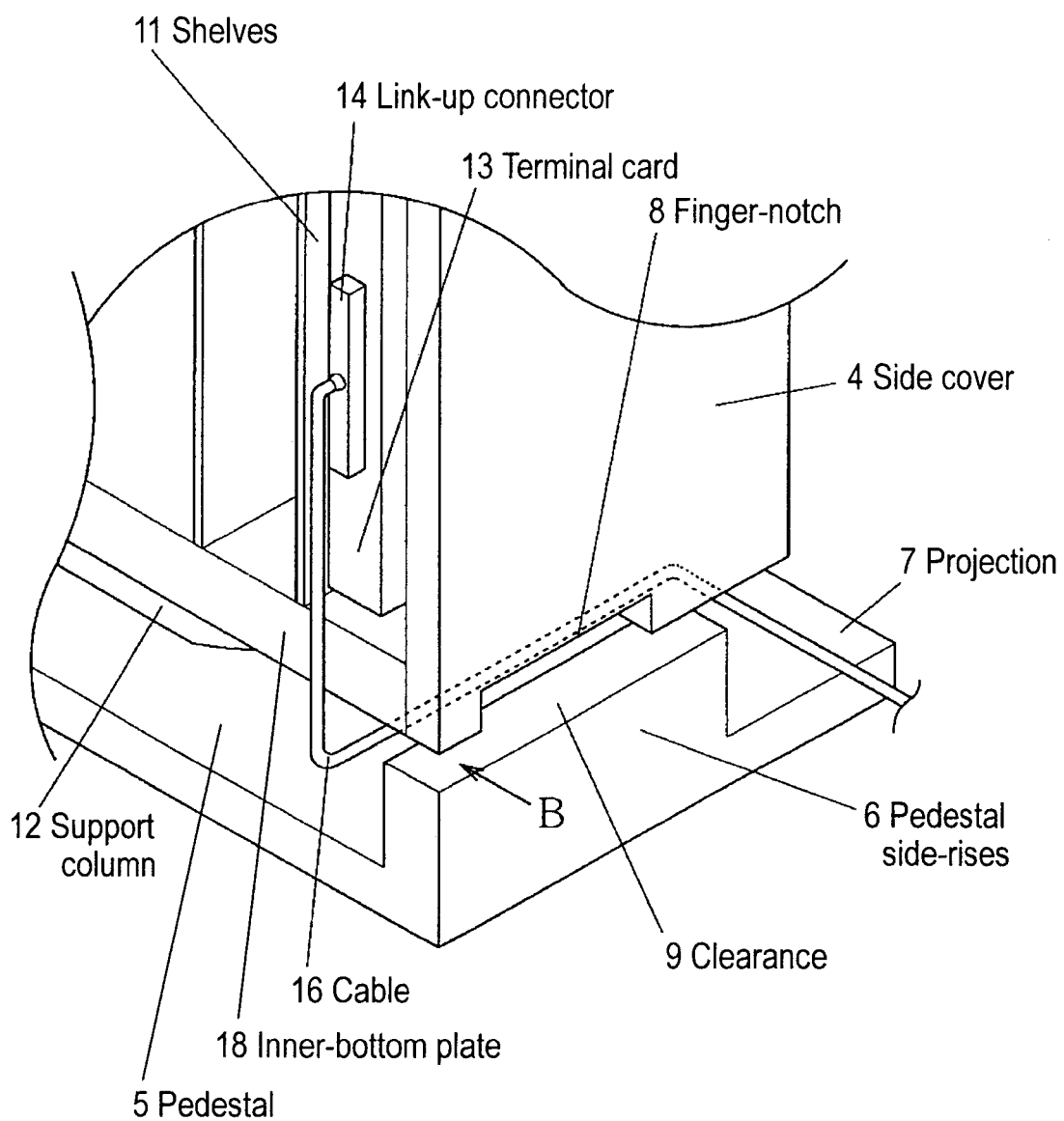
FIG. 4 is a perspective view of the PBX with the essential part enlarged in accordance with the preferred embodiment.
Figure 5:
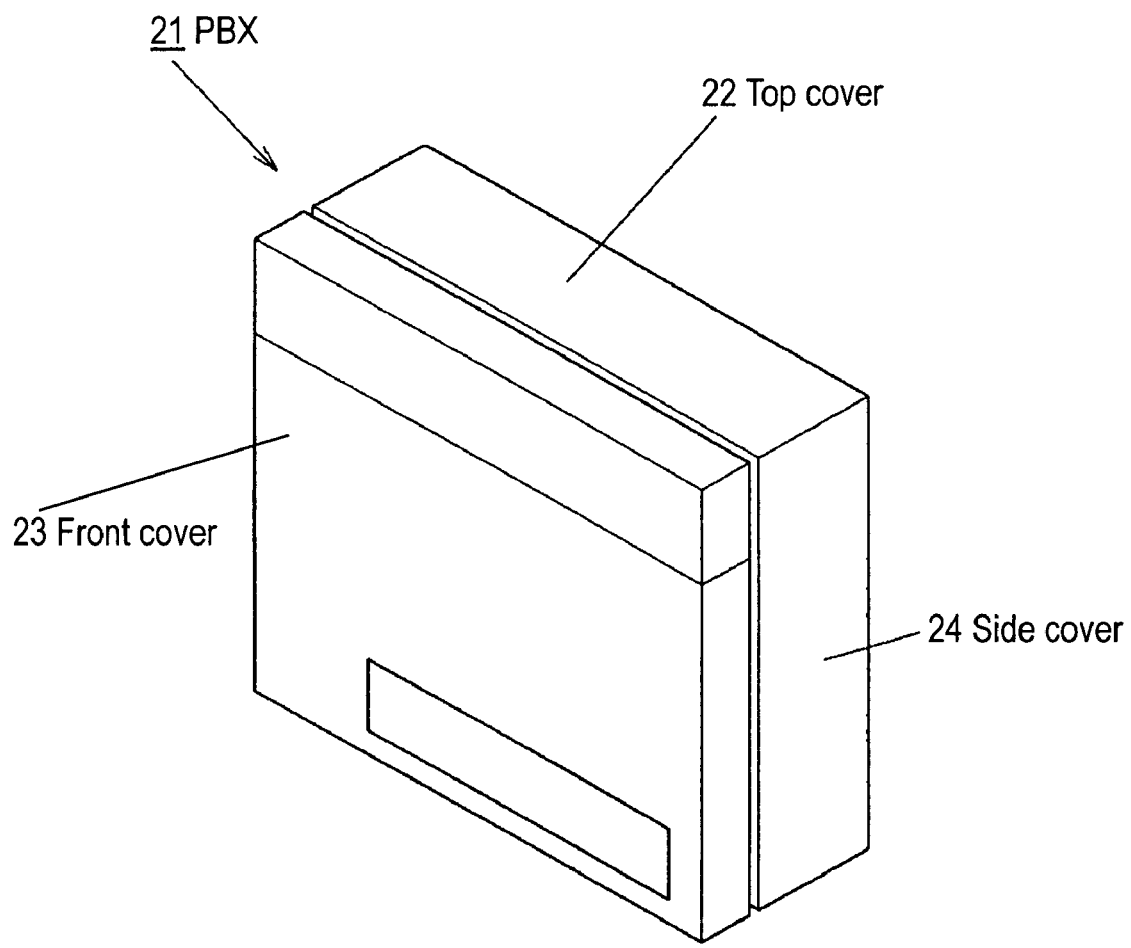
FIG. 5 is a perspective view indicating the essential part of a prior-art PBX.
Figure 6:
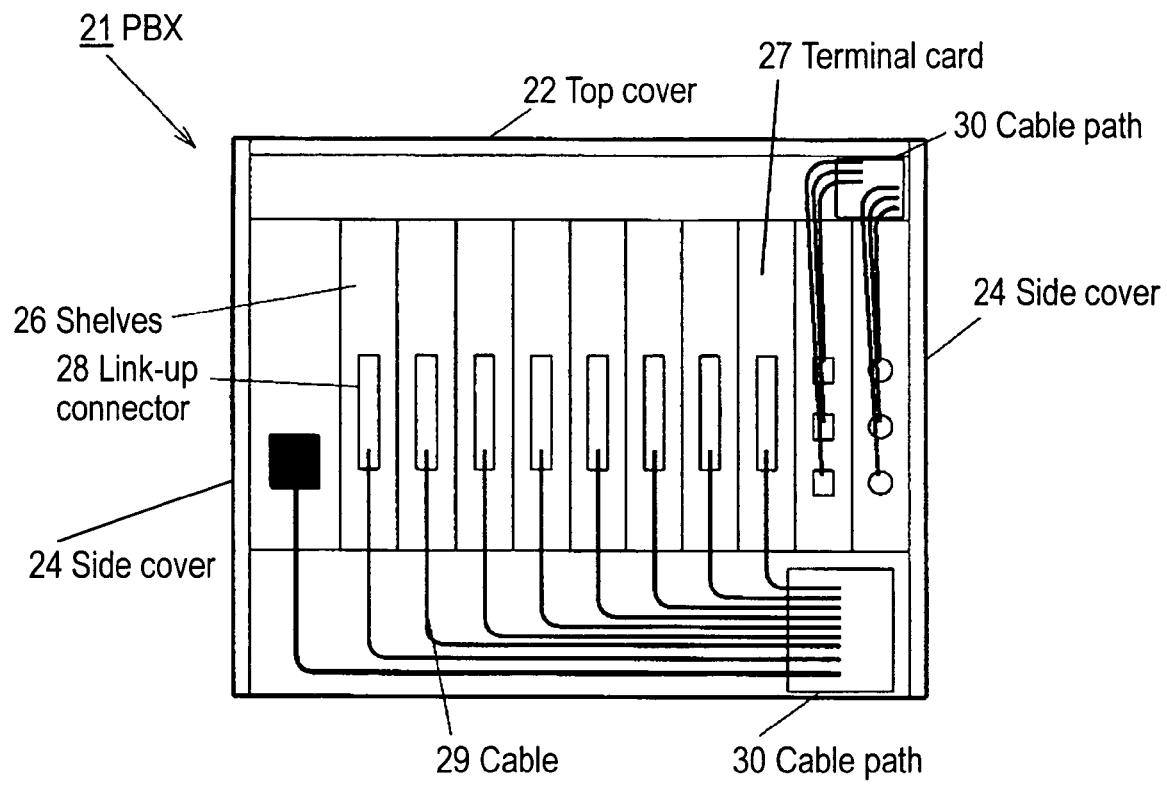
FIG. 6 is a front view indicating the essential part of the prior-art PBX with a front cover removed.

FIG. 4 is a perspective view of the PBX with the essential part enlarged in accordance with the preferred embodiment.

FIG. 4 shows the PBX with the front cover removed—the front cover is not shown in the figure.

In PBX 1 shown in FIG. 4, portions similar to those shown in FIGS. 1 and 2, namely, side cover 4, pedestal 5, side-rises 6, projection 7, and finger-notch 8, clearance 9, shelves 11, support column 12, terminal card 13, link-up connector 14, and inner-bottom plate 18 have the same reference numbers, and descriptions of those are omitted.

Cable 16 is connected with link-up connector 14. Cable 16 may be a bunch of lead wires to be connected to a telephone and other terminals, or may be a fiber-optic cable connected to a plurality of communication terminals.

To add slot terminal card 13, the operator removes front cover 3 from PBX 1 and then inserts the card into a vacant slot of shelves 11 in PBX 1.

Link-up connector 14 of terminal card 13 is supposed to connect with one end of cable 16 and the other end of the cable is for connecting to the terminals including a telephone (not shown).

FIG. 4 shows the state in which terminal card 13 is inserted into the rightmost slot seen from the front side of PBX 1. In the state, cable 16 hangs down on the front side of PBX 1.

The operator now leads a part of cable 16 into the interior of side cover 4 from the outside—moves the part of the cable in the direction B—so as to run through clearance 9. As a result, cable 16 runs, as shown in FIG. 4, from the front through the interior to the side or the rear of PBX 1. After the wiring, the operator reinstalls front cover 3 to PBX 1.

The wiring of cable 16 from the front to the side or the rear of PBX 1 now completes.

In the wiring work, pedestal side-rises 6 keep cable 16 running from the front to the side or the rear against moving outside of the casing. Accordingly a proper wiring of cable 16 can be performed in reliable manner.

As described above, pedestal side-rises 6 stand up toward the side surface of the casing through a clearance. The structure can keep the cables inside of PBX 1, coping well with the increase in cables wired.

Besides, pedestal side-rises 6 is disposed so as to cover the cables wired, so that the cables wired inside are not seen from the outside. This provides PBX 1 with an improved appearance.

FIG. 4 shows, for simplicity, the state in which only one cable is wired. It will be understood that, in the practical use, cables 16 which correspond to terminal cards 13 slotted into shelves 11 respectively are wired from the front to the side or the rear of PBX 1.

According to the embodiment of the present invention, the PBX with the structure described above offers benefits as follows:

(1) Because the PBX has column 12, cables 16 can be wired from the front of PBX 1 through the clearance formed on the side of column 12 to the side or the rear of PBX 1. Besides, when cables 16 are wired, there is no need to remove side cover 4 disposed on the side of PBX 1 for wiring, enabling easy wiring work.

(2) When PBX 1 is mounted on the wall, projection 7 allows PBX 1 to keep a predetermined interval between the wall and the rear of the casing. In the wiring of cable 16 from the front to the side of PBX 1, the structure offers enough room for passing cable 16 on the side of PBX 1. In this way, even in the case that a plurality of cables 16 is wired, the wiring is easily performed.

(3) Pedestal side-rises 6 protect cables 16, which are wired through the clearance formed on the side of support column 12, from moving outside the casing. Creating clearance 9 so as to be barely wide enough for passing cable 16 allows cables 16 to be not seen from the outside. This provides PBX 1 with an improved appearance.

(4) The structure has finger-notch 8, therefore, engaging fingers in notch 8 to hold the PBX, the operator can easily carry PBX 1 in installation including add-on installation or maintenance work.

(5) The structure offers spaces required for wiring work at the both sides, therefore, in the wiring work, the operator can use both of, or one of the spaces according to the circumstances in which the PBX is installed.

Although the preferred embodiment introduces a free-slot type PBX, it is not limited thereto. The PBX having a plurality of cable connections on the front side can offer the same effect according to the present invention.

INDUSTRIAL APPLICABILITY

The PBX of the present invention, as described above, has industrial applicability below.

The operator can wire cables from the front of the PBX, through a clearance formed on the side of the support column, to the rear or the side of the PBX. In addition, the operator can easily wire the cables without removing the side-mounted side cover or the rear-mounted back cover from the casing in the wiring or maintenance work. The PBX of the present invention thus enhances efficiencies in wiring and maintenance work.

The PBX has a support column whose front-side surface is formed into a smooth curve. The structure protects cables from causing defects even if the cables contact with the column while the wiring-work. As the result, the PBX offers easy wiring work.

The pedestal side-rises keeps the cables, which are wired through the clearance on the side of the support column-side, from going away from to the outside. Further, the side-rises provide the PBX with good appearance.

Even in case that a bunch of cables are wired, the side-rises keep the cables from going away to the outside. Thus the PBX with high efficiency in wiring work is provided.

In addition, the side-rises are disposed on both sides of the pedestal so as to cover the cables wired, so that the cables are not seen from the outside Thus the PBX with an improved appearance is provided.

The structure has the finger-notches. Accordingly, there is no need to form something to be held by hands. Therefore the appearance is not spoiled. In installation including add-on installation and maintenance work, the operator can easily move the PBX, by holding the notches. Thus the PBX offering easy carry is provided The PBX has the center-disposed support column and the clearance for wiring cables on both sides of the column. As the installation circumstances demand, the operator can wire the cables through the clearance on either side, or both sides of the column. Such structure provides the PBX which is easily used.

What is claimed is:

1. A private branch exchange (PBX) comprising:
   a PBX section; and
   a casing covering and holding said PBX section, said casing including an inner-bottom plate, a support column and a pedestal,
   wherein a cable for connecting with an external circuitry is able to be connected to said PBX section on a front side of the casing, the inner-bottom plate holds a bottom of a part of the casing in which said PBX section is accommodated, the support column is placed on a lower surface of the inner-bottom plate and the pedestal is coupled to a bottom of the support column.

2. The PBX as defined in claim 1, wherein the support column has a curved surface at least on the front side.

3. The PBX as defined in claim 2, wherein pedestal side-rises stand at least on both sides of the pedestal, having a clearance between a side surface of the casing and each of the side-rises.

4. The PBX as defined in claim 2, wherein a shallow U-shaped finger notch is disposed on the lower end of a side surface of the casing.

5. The PBX as defined in claim 4, wherein the support column is generally centered on the lower surface of the inner-bottom plate.

6. The PBX as defined in claim 2, wherein the support column is generally centered on the lower surface of the inner-bottom plate.

7. The PBX as defined in claim 3, wherein a shallow U-shaped finger notch is disposed on the lower end of a side surface of the casing.

8. The PBX as defined in claim 3, wherein the support column is generally centered on the lower surface of the inner-bottom plate.

9. The PBX as defined in claim 7, wherein the support column is generally centered on the lower surface of the inner-bottom plate.

10. The PBX as defined in claim 1 wherein pedestal side-rises stand at least on both sides of the pedestal, having a clearance between a side surface of the casing and each of the side-rises.

11. The PBX as defined in claim 10, wherein a shallow U-shaped finger notch is disposed on the lower end of a side surface of the casing.

12. The PBX as defined in claim 10, wherein the support column is generally centered on the lower surface of the inner-bottom plate.

13. The PBX as defined in claim 11, wherein the support column is generally centered on the lower surface of the inner-bottom plate.

14. The PBX as defined in claim 1, wherein a shallow U-shaped finger notch is disposed on the lower end of a side surface of the casing.

15. The PBX as defined in claim 14, wherein the support column is generally centered on the lower surface of the inner-bottom plate.

16. The PBX as defined in claim 1, wherein the support column is generally centered on the lower surface of the inner-bottom plate.

17. The PBX as defined in claim 1, wherein the casing includes a front cover that extends beyond the inner-bottom plate toward the pedestal.

18. The PBX as defined in claim 17, wherein the inner-bottom plate, the support column, the pedestal, and the front cover form clearance in which the cables are accommodated.

* * * * *